(12) United States Patent
Li et al.

(10) Patent No.: US 7,897,137 B2
(45) Date of Patent: Mar. 1, 2011

(54) METHOD FOR PRODUCING HIGH-ACTIVE TITANIUM DIOXIDE HYDROSOL BY USING METATITANATE AS PRECURSOR

(75) Inventors: Fangbai Li, Guangzhou (CN); Tongxu Liu, Guangzhou (CN)

(73) Assignee: Guangdong Institute of Eco-Environment and Soil Sciences, Guangzhou, Guangdong Provice (CN)

( * ) Notice: Subject to any disclaimer, the term of this patent is extended or adjusted under 35 U.S.C. 154(b) by 1001 days.

(21) Appl. No.: 11/372,874

(22) Filed: Mar. 10, 2006

(65) Prior Publication Data

US 2007/0082959 A1   Apr. 12, 2007

(30) Foreign Application Priority Data

Sep. 27, 2005   (CN) .................... 2005 1 0037505

(51) Int. Cl.
*C01G 23/047*   (2006.01)
*C01G 23/08*   (2006.01)
(52) U.S. Cl. ........................ 423/610; 516/90
(58) Field of Classification Search ............ 516/90; 423/610, 608
See application file for complete search history.

(56) References Cited

U.S. PATENT DOCUMENTS 5,204,300 A * 4/1993 Kumagai et al. ............ 501/127
2008/0138272 A1 * 6/2008 Ohmori et al. .............. 423/622

* cited by examiner

Primary Examiner—Timothy C Vanoy
Assistant Examiner—James A Fiorito
(74) Attorney, Agent, or Firm—Charles E. Baxley

(57) ABSTRACT

A method for producing high-active titanium dioxide anatase hydrosol by using metatitanate as precursor, is characterized in comprising the following steps in order: (1) Wash process: adding alkali to wash so as to remove sulfate ion; (2) Dispersion process: adding acid to disperse the filter cake and obtaining a uniform suspension; (3) Peptization process: peptizing the suspension obtained in dispersion process according to the method of (a), (b) or (c). When producing transition metal or rare earth doped anatase hydrosol, transition metal or rare earth salt solution with a predetermined concentration is first prepared, and then added into the metatitanate suspension which has not been washed by alkali. Subsequently, the resulting suspension is filtered and washed until no sulfate ion is present. When producing precious metal deposited anatase hydrosol, precious metal solution is added into prepared pure anatase hydrosol, and then, the resulting solution is irradiated with ultraviolet light for 0.5-10 hours under stirring continuously. The advantages and beneficial effects of the present invention are as follows: (1) the raw material has low price and little pollution as well as abundant source; (2) the hydrosol has excellent degree of dispersibility and higher anatase crystallization; (3) the hydrosol has higher activity under visible light irradiation owing to doping/depositing technique; (4) the properties and activity of the hydrosol can be further enhanced by using post disposal, such as microwave and ultrasonic technique; and (5) the hydrosol is a kind of nano-material with about 10 nm particle size. The anatase hydrosol can be applied for indoor air purification, crop disease control, odor control and so on.

12 Claims, 3 Drawing Sheets

Figure 1:
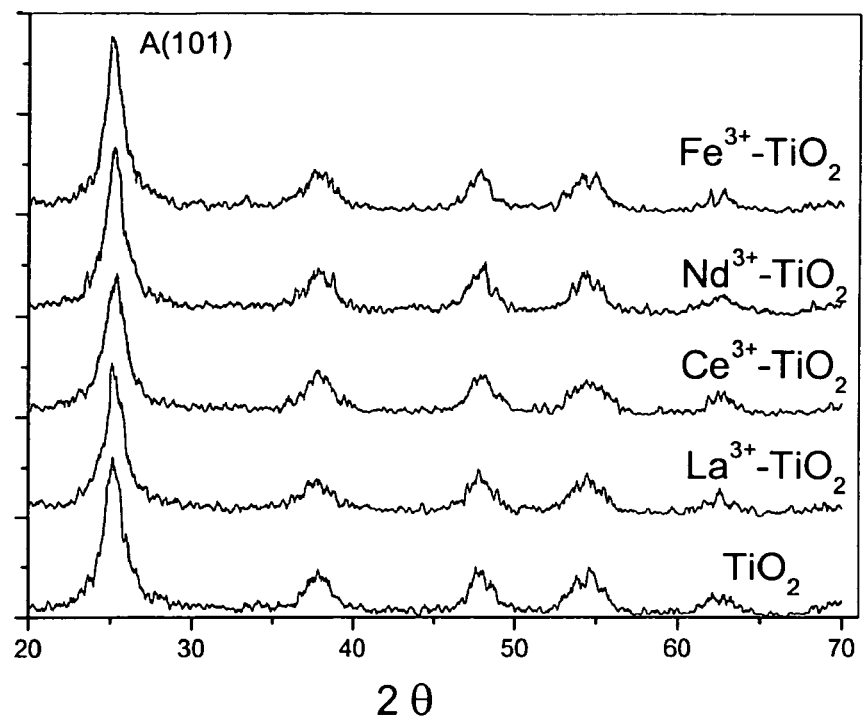

METHOD FOR PRODUCING HIGH-ACTIVE TITANIUM DIOXIDE HYDROSOL BY USING METATITANATE AS PRECURSOR

TECHNICAL FIELD

The present invention relates to a method for producing high-active titanium dioxide anatase hydrosol by using metatitanate as precursor in the field of nano-material preparation for environmental purpose.

BACKGROUND ART

The titanium reserves in China, which account for over 35% of the world's titanium reserves, are the largest in the world. Moreover, over 90% of the Chinese titanium reserves are located in Panzhihua. However, the percentage of titanium utilization is currently less than 5%. Titanium is basically used in the production of titanium dioxide powder and rarely applied in environmental field.

In recent years, titanium dioxide as a semiconductor material with lots of advantages, such as excellent photocatalytic activity, anti-corrosion, stabilization of chemical properties, innocuity etc. has been studied in the filed of photocatalytic technique for waste water treatment, air purification and so on. By the forecasts of authority institutions in Japan, Korea and Occident, the photocatalytic technique still has tremendous market potential. Therefore, the development of high-active titanium dioxide photocatalytic material not only meets the market requirements, but also promotes deep processing and comprehensive utilization of titanium resource in China.

At present, the main raw materials for producing titanium dioxide anatase hydrosol include inorganic titanium source and organic titanium source. Wherein, organic titanium sources include mainly tetrabutyl titanate, isopropyl titanate, ethyl titanate, methyl titanate and titanium alkoxides, etc. while inorganic titanium sources include mainly titanium tetrachloride, titanium sulfate etc. In the patent application No. 200410077615.0, methods for producing anatase hydrosol having high-activity under visible light by using inorganic titanium source, such as titanium tetrachloride, titanium oxysulfate and titanium sulfate etc. were disclosed respectively. However, such organic and inorganic titanium raw materials are the chemical products obtained by second or even third processing of the titanium ores at a higher price.

CONTENTS OF THE INVENTION

The object of the present invention is to produce anatase hydrosol having excellent degree of dispersibility and higher anatase of crystallization by using metatitanate. The photocatalytic activity of the hydrosol under visible light can be greatly enhanced by applying rare earth/transition metal doping or precious metal depositing technique. The properties and activity of the hydrosol can be further enhanced by using post disposal, such as microwave or ultrasonic technique.

The object of the present invention can be realized by the following technical methods: a method for producing high-active titanium dioxide hydrosol by using metatitanate as precursor is characterized in comprising the following steps in order:

(1) Wash process: adding alkali to wash so as to remove sulfate ion. Namely, adding water into metatitanate and mixing them uniformly, adding alkali solution therein to adjust pH value to be 7 to 13, stirring them uniformly at 10 to 40° C. filtering the treated suspension to get a filter cake, washing the resulting filter cake to remove sulfate ion (determined by 0.5M barium chloride for titration until no sulfate ion is present in the filtrate); repeating the above steps one to three times; adding water to wash the filter cake until the pH value is near to neutral;

(2) Dispersion process: adding acid to disperse the filter cake. Adding water into filter cake and mixing them uniformly, adding acid solution therein to adjust pH value to be between 0.1 and 3.0, stirring them uniformly to obtain a uniform suspension;

(3) Peptization process: peptizing the suspension obtained in dispersion process according to the method of (a), (b) or (c):

(a) dispersing the suspension for 3 to 60 hours while keep heating at 40 to 95° C. under stirring continuously to obtain titanium dioxide anatase hydrosol;

(b) dispersing the suspension for 5-100 minutes, then heating the dispersed suspension for 0.5-40 hours under stirring continuously at 50 to 300° C. and under the pressure of $10^5$-$5\times10^6$ Pa to obtain titanium dioxide anatase hydrosol;

(c) dispersing the suspension for 5 to 100 minutes, then heating the dispersed suspension under stirring continuously at 50 to 2000 W microwave power for 2 to 20 hours to obtain titanium dioxide anatase hydrosol;

When producing transition metal or rare earth doped anatase hydrosol, transition metal or rare earth salt solution with a predetermined concentration is first prepared, and then added into the uniform metatitanate suspension which has not been washed by alkali. Subsequently, the resulting suspension is filtered and washed until no sulfate ion is present;

When producing precious metal deposited anatase hydrosol, precious metal solution is added into a prepared pure anatase hydrosol, and then, the resulting solution is irradiated with ultraviolet light for 0.5-10 hours under stirring continuously.

The said alkali solution is selected from sodium hydroxide, potassium hydroxide or ammonia.

The said acid solution is selected from hydrochloric acid, nitric acid, acetic acid or phosphoric acid, preferably nitric acid, hydrochloric acid.

The said rare earth metal salts and their oxides thereof are selected from the rare earth nitrate of lanthanum, cerium, neodymium europium or gallium and their oxides thereof.

The said transition metal is selected from the salt of iron or copper.

The said precious metal is selected from the salt of gold, argentine or platinum.

In step (1), the pH value is preferably adjusted to be 8 to 12.

In step (2), the pH value is preferably adjusted to be 0.5 to 2.0.

In said (a) of step (3), the suspension is stirred for preferably 8-50 hours while heating at 49-95° C. to obtain titanium dioxide hydrosol with a higher anatase crystallization.

In step (b) of step (3), the suspension is dispersed for 5 to 100 minutes, then heating for 2-20 hours at 50-300° C. under the pressure $10^5$-$5\times10^6$ Pa to obtain titanium dioxide anatase hydrosol;

In said (c) of step (3), the suspension is dispersed for 5 to 100 minutes, then heating for 3-10 hours at the microwave power of preferably 100-600 w to obtain titanium dioxide anatase hydrosol;

The advantages and beneficial effects of the present invention are as follows:

1. The anatase hydrosol prepared by the present invention has a higher stability with a higher concentration of $TiO_2$, and will not flocculate or precipitate after long time storage or dilution.
2. The anatase hydrosol prepared by the present invention appears slightly blue with no smell, containing no any organic compound and not resulting in secondary pollution.

3. The absorption spectra of hydrosol doped with transition or rare earth metals appear obvious red-shift, compared to that of the pure hydrosol. The photocatalytic activity under visible light is significantly enhanced.
4. The titanium dioxide in hydrosol has an anatase structure with higher degree of crystallization, therefore avoiding rapid growth and conglomeration of crystal-grain during the calcinations process at high temperature for $TiO_2$ powder.
5. The $TiO_2$ hydrosol particles is a kind of nano-material with the particle size of about 10 nm and large specific surface area and strong adhesion.
6. The technique of the preparation process of the present invention is simple, easy to handle, and can produce a series of products according to different product requirements.
7. The raw material used in the present invention is the intermediate product from titanium dioxide powder industry, i.e. metatitanate with low price and little pollution as well as abundant source, which is beneficial to promote cleaning production.

DESCRIPTION OF APPENDED DRAWINGS

FIG. 1: The XRD patterns of the prepared hydrosols doped with different metals according to example 1-5.

Figure 2:
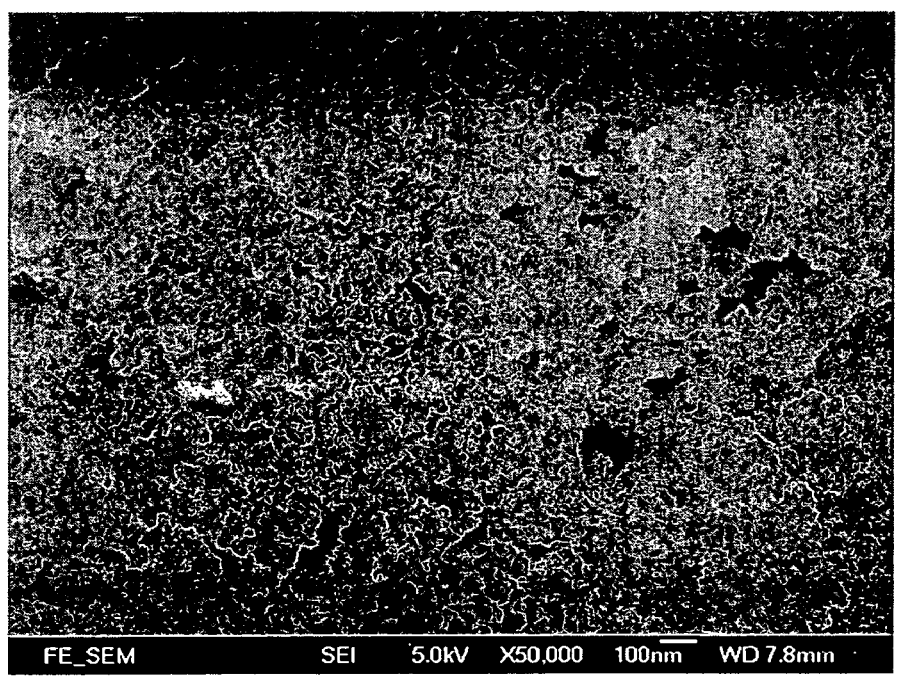

FIG. 2: The SEM morphology of pure hydrosol.

Figure 3:
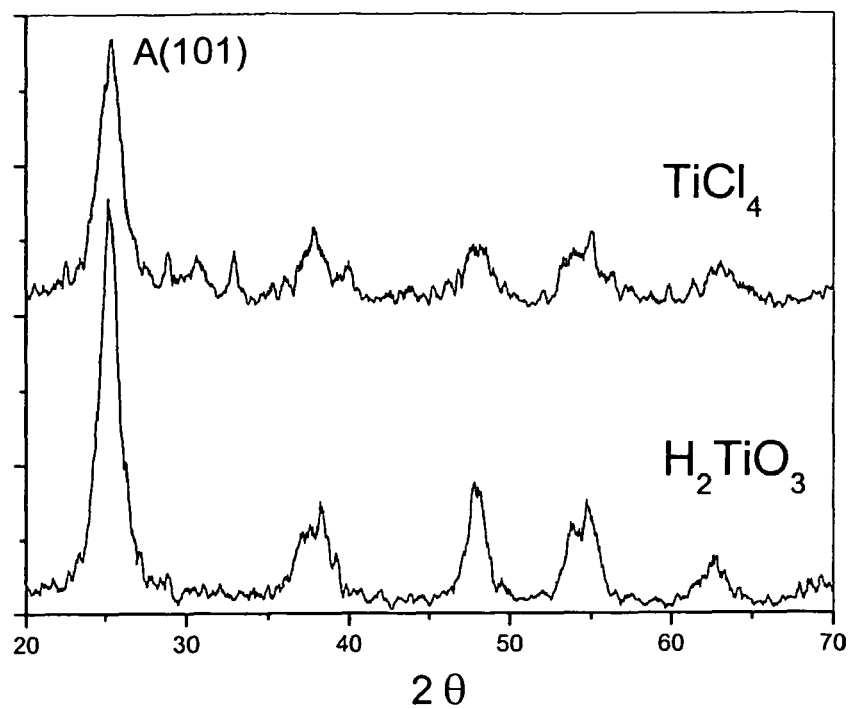

FIG. 3: The XRD patterns of hydrosols prepared by using different titanium source.

Figure 4:
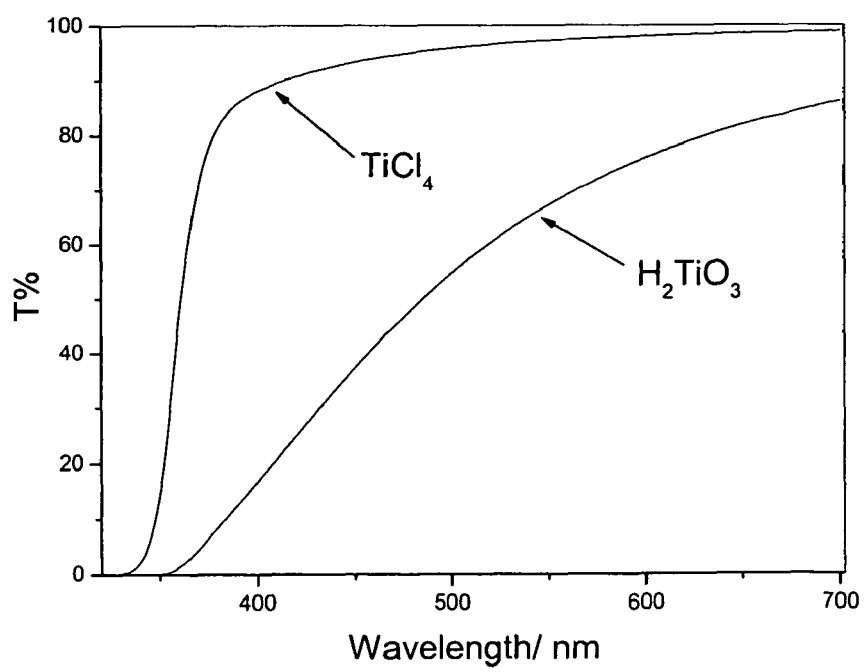

FIG. 4: The UV-visible transmittance spectra of hydrosols prepared by using different titanium source.

Figure 5:
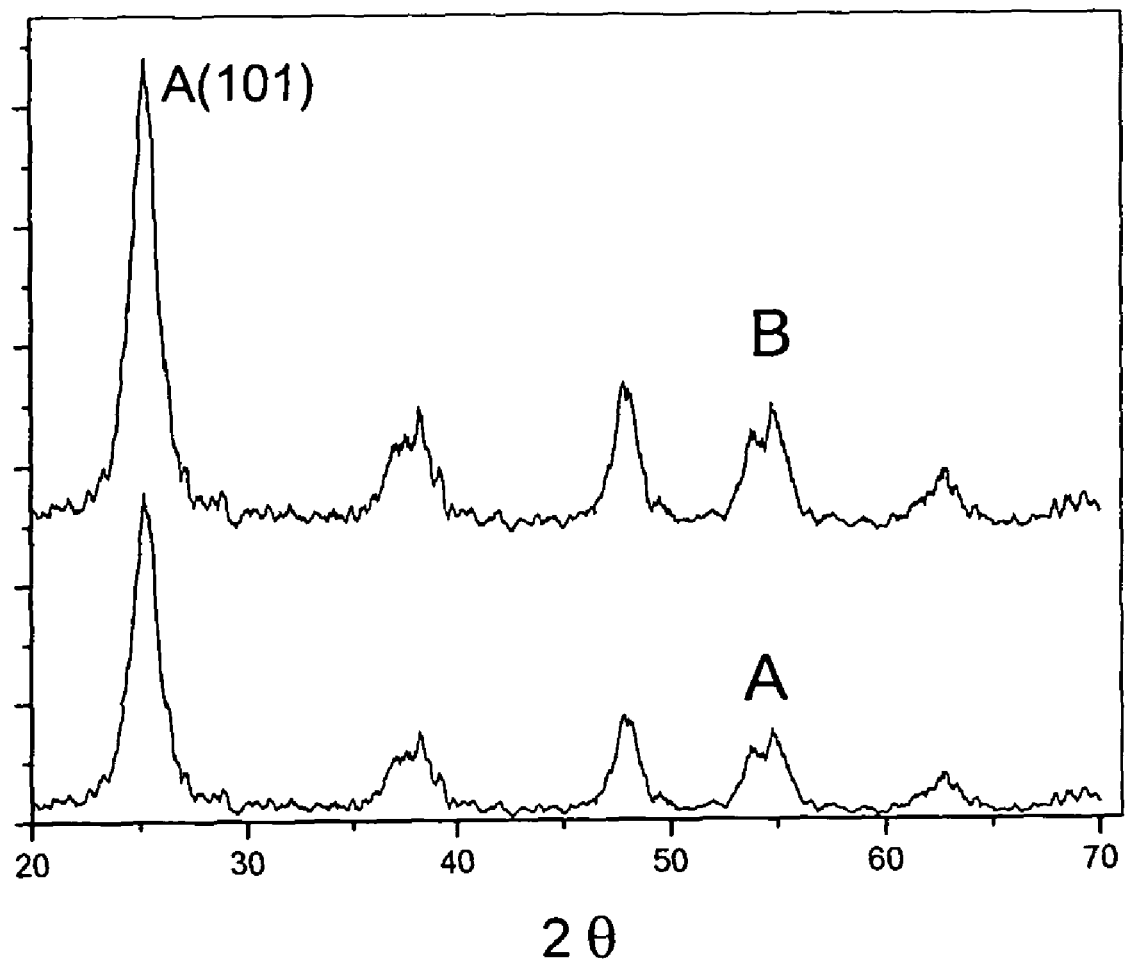

FIG. 5: The effect of microwave treatment on the degree of crystallization and XRD patterns of the prepared hydrosol.

DETAILED DESCRIPTION OF PREFERRED EMBODIMENTS OF THE INVENTION

The present invention will be further described in the following examples and the appended drawings, which are not intended to limit the scope and spirit of the present invention.

EXAMPLE 1

The Method for Producing Titanium Dioxide Anatase Hydrosol with High Purity by Utilizing Metatitanate Provided by PANZHIHUA IRON & STEEL FACTORY, (the Same as the Followings) as Precursor.

Water is added into 100 g of metatitanate raw material, then stirring continuously and uniform suspension is obtained. Excessive amount of ammonia is dropped therein to adjust the pH value to be above 8. The resulting suspension is stirred continuously for 3 hours and heated at a temperature below 40° C. and then filtered to get a filter cake. The filter cake is washed repeatedly for several times until no sulfate ion is present (determined by 0.5 mol/L barium chloride solution titration); then the washed filter cake is uniformly mixed with water again to form uniform suspension. Excessive ammonia is again dropped therein to adjust the pH value above 8. The resulting suspension is stirred continuously for 2 hours and heated at a temperature below 40° C. and then is filtered to get a filter cake. The filter cake is washed repeatedly for several times until no sulfate ion is present (determined by 0.5 mol/L barium chloride solution titration). Subsequently, the filter cake is washed repeatedly with deionized water until pH value is near the neutral. In this way, the impurities can be substantively removed. Finally, the filter cake is uniformly mixed with water to form uniform suspension. 200 ml of nitric acid with a concentration of 10% is dropped therein to adjust the pH value to be between 1 and 2. The resulting suspension is stirred continuously for 2 to 4 hours at room temperature, followed by stirring and heating at a temperature between 40 and 90° C. The suspension is peptized for 1.5 to 40 hours and titanium dioxide anatase hydrosol is obtained.

EXAMPLE 2

The Method for Producing Titanium Dioxide Anatase Hydrosol Doped with Cerium Ion by Utilizing Metatitanate as Precursor.

Water is added into 90 g of metatitanate raw material, then stirring continuously and uniform suspension is obtained. Then, 2.3 g of cerium nitrate is dissolved to obtain cerium nitrate solution, which is added into the metatitanate suspension and uniformly mixed. Excessive amount of ammonia is dropped therein to adjust the pH value to be above 9. The resulting suspension is stirred continuously for 3 hours and heated at a temperature below 40° C., and then filtered to get a filter cake. The filter cake is washed repeatedly for several times until no sulfate ion is present (determined by 0.5 mol/L barium chloride solution titration); then the washed filter cake is uniformly mixed with water again to form uniform suspension. Excessive ammonia is again dropped therein to adjust the pH value above 8. The resulting suspension is stirred continuously for 2 hours and heated at a temperature below 40° C. and then is filtered to get a filter cake. The filter cake is washed repeatedly for several times until no sulfate ion is present (determined by 0.5 mol/L barium chloride solution titration). Subsequently, the filter cake is washed repeatedly with deionized water until pH value is near to neutral. In this way, the impurities can be substantively removed. Finally, the filter cake is uniformly mixed with water to form uniform suspension. 190 ml of nitric acid with a concentration of 10% is dropped therein to adjust the pH value to be between 0.5 and 1.5. The resulting suspension is stirred continuously for more than 2 hours at room temperature, followed by stirring and heating at a temperature between 40 and 90° C. The suspension is peptized for 2 to 30 hours and slight yellowish titanium dioxide anatase hydrosol doped cerium with 1% mom/mol dosage ($Ce^{3+}$—$TiO_2$) is obtained.

EXAMPLE 3

The Method for Producing Titanium Dioxide Anatase Hydrosol Doped with Lanthanum Ion by Utilizing Metatitanate as Precursor.

Water is added into 110 g of metatitanate raw material, then stirring continuously and uniform suspension is obtained. Then, 2.7 g of Lanthanum nitrate is dissolved to obtain lanthanum nitrate solution, which is added into the metatitanate suspension and uniformly mixed. Excessive amount of ammonia is dropped therein to adjust the pH value to be above 10. The resulting suspension is stirred continuously for 2 hours and heated at a temperature below 40°, and then filtered to get a filter cake. The filter cake is washed repeatedly for several times until no sulfate ion is present (determined by 0.5 mol/L barium chloride solution titration); then the washed filter cake is uniformly mixed with water again to form uniform suspension. Excessive ammonia is again dropped therein to adjust the pH value above 9. The resulting suspension is stirred continuously for 2 hours and heated at a temperature below 40 ° C. and then is filtered to get a filter cake. The filter cake is washed repeatedly for several times until no sulfate ion is present (determined by 0.5 mol/L barium chloride solution titration). Subsequently, the filter cake is washed repeatedly with deionized water until pH value is near to neutral. In this way, the impurities can be substantively removed. Finally, the filter cake is uniformly mixed with water to form uniform suspension. 190 ml of nitric acid with a concentration of 10% is dropped therein to adjust the pH value to be between 0.8 and 1.6. The resulting suspension is stirred continuously for more than 2 hours at room temperature. The resulting suspension is stirred for more than 2 hours at room temperature, and then sonicated for 50 minutes for dispersing. Finally, the resulting suspension is transferred into a sealed pressure-proof reactor with the pressure of $3 \times 10^5$ to $10^6$ Pa and the temperature between 80 and 250° C. and is peptized for 6 to 20 hours. Titanium dioxide hydrosol doped with Lanthanum with 1% mom/mol dosage ($La^{3+}$—$TiO_2$) is obtained.

EXAMPLE 4

The Method for Producing Titanium Dioxide Anatase Hydrosol Doped with Neodymium Ion by Utilizing Metatitanate as Precursor.

Water is added into 120 g of metatitanate raw material, then stirring continuously and uniform suspension is obtained. Then, 3.1 g of neodymium nitrate is dissolved to obtain lanthanum nitrate solution, which is added into the metatitanate suspension and uniformly mixed. Excessive amount of ammonia is dropped therein to adjust the pH value to be above 10. The resulting suspension is stirred continuously for 2 hours and heated at a temperature below 40° C. and then filtered to get a filter cake. The filter cake is washed repeatedly for several times until no sulfate ion is present (determined by 0.5 mol/L barium chloride solution titration); then the washed filter cake is uniformly mixed with water again to form uniform suspension. Excessive ammonia is again dropped therein to adjust the pH value above 9. The resulting suspension is stirred continuously for 2 hours and heated at a temperature below 40° C. and then is filtered to get a filter cake. The filter cake is washed repeatedly for several times until no sulfate ion is present (determined by 0.5 mol/L barium chloride solution titration). Subsequently, the filter cake is washed repeatedly with deionized water until pH value is near to neutral. In this way, the impurities can be substantively removed. Finally, the filter cake is uniformly mixed with water to form uniform suspension. 210 ml of nitric acid with a concentration of 10% is dropped therein to adjust the pH value to be between 0.7 and 2.5. The resulting suspension is stirred continuously for more than 2 hours at room temperature. The resulting suspension is stirred for more than 2 hours at room temperature, and then sonicated for 80 minutes for dispersing. Finally, the resulting suspension is transferred into a sealed pressure-proof reactor with the pressure of $6 \times 10^5$ to $1.5 \times 10^6$ Pa and the temperature between 80 and 250° C. and is peptized for 6 to 20 hours. Titanium dioxide hydrosol doped with neodymium with 1% mom/mol dosage ($Nd^{3+}$—$TiO_2$) is obtained.

EXAMPLE 5

The Method for Producing Titanium Dioxide Anatase Hydrosol Doped with Ferric Ion by Utilizing Metatitanate as Precursor.

Water is added into 85 g of metatitanate row material, then stirring continuously and uniform suspension is obtained. Then, 2.8 of ferric nitrate is dissolved to obtain lanthanum nitrate solution, which is added into the metatitanate suspension and uniformly mixed. Excessive amount of ammonia is dropped therein to adjust the pH value to be above 10. The resulting suspension is stirred continuously for 2 hours and heated at a temperature below 40° C., and then filtered to get a filter cake. The filter cake is washed repeatedly for several times until no sulfate ion is present (determined by 0.5 mol/L barium chloride solution titration); then the washed filter cake is uniformly mixed with water again to form uniform suspension. Excessive ammonia is again dropped therein to adjust the pH value above 9. The resulting suspension is stirred continuously for 2 hours and heated at a temperature below 40° C. and then is filtered to get a filter cake. The filter cake is washed repeatedly for several times until no sulfate ion is present (determined by 0.5 mol/L barium chloride solution titration). Subsequently, the filter cake is washed repeatedly with deionized water until pH value is near to neutral. In this way, the impurities can be substantively removed. Finally, the filter cake is uniformly mixed with water to form uniform suspension. 195 ml of nitric acid with a concentration of 10% is dropped therein to adjust the pH value to be between 1.2 and 2.9. The resulting suspension is stirred continuously for more than 2 hours at room temperature. The resulting suspension is stirred for more than 2 hours at room temperature, and then sonicated for 100 minutes for dispersing. Finally, the resulting suspension is transferred into a microwave oven with the power of 300 to 600 w, and is peptized for 2 to 6 hours. Titanium dioxide hydrosol doped with ferric with 1% mom/mol dosage ($Fe^{3+}$—$TiO_2$) is obtained.

EXAMPLE 6

The Method for Producing Titanium Dioxide Anatase Hydrosol Deposited by Silver

Pure titanium dioxide hydrosol is prepared by means of the method of example 1. Silver nitrate solution with a predetermined concentration is prepared according to the required dosage. Then silver nitrate solution is slowly dropped into the hydrosol under stirring continuously, and then placed in a transparent glass bottle and irradiated for more than 3 hours by using ultraviolet lamp under stirring continuously. Blue-gray titanium dioxide hydrosol deposited with silver (Ag—$TiO_2$) is obtained.

EXAMPLE 7

Comparison of the Crystal Structure (XRD) and Morphology (SEM) of Titanium Dioxide Hydrosols Doped with Different Metals thereof The hydrosol samples prepared by means of example 1 to example 5 are individually dried for more than 12 hours at 60° C. and then ground into powder. Their crystal structure is determined by means of XRD, as shown in FIG. 1. The results show that the crystallization of the hydrosols should be inhibited slightly by doped metal ions, wherein the effect of cerium is most significant. The results of Scanning Electron Microscope (SEM) images in FIG. 2 show that the hydrosol particles are spherical in shape with uniform size between 10 and 20 nm.

EXAMPLE 8

Comparison of Hydrosols Prepared by Using Metatitanate and by Using Titanium Tetrachloride as a Precursor The hydrosol prepared in Example 1 by using metatitanate ($H_2TiO_3$) as a precursor and the hydrosol prepared in Chinese patent No. 200410077615.0) by using titanium tetrachloride ($TiCl_4$) are dried for more than 12 hours at 60° C. and ground into powder. Their XRD graph is shown in FIG. 3. The results showed that the degree of crystallization of the hydrosol prepared by using metatitanate should be significantly higher than that by using titanium tetrachloride. The UV-visible transmittance spectra in FIG. 4 show that the hydrosol prepared by using titanium tetrachloride should be more transparent than that by using metatitante. That implies that the particle size of the former is smaller than that of the latter. However, higher crystallization might be helpful to phtocatalytic activity.

EXAMPLE 9

The Method for Improving Dispersibility and Crystallization by Means of Sonification and Microwave Techniques The hydrosol (A) is placed in an ultrasound field for 20 minutes, and then cold down, followed treatment for another 20 minutes again for 3 to 5 times. Subsequently, the treated hydrosol sample is placed in a microwave oven and treated at the power of 180 w for 15 minutes, then cold down; in this way, treated for 6-8 times. The hydrosol B is obtained. The result of XRD in FIG. 5 shows that the crystalline of hydrosol should be enhanced significantly by microwave treatment. Moreover, the dispersibility should be enhanced somewhat by sonification treatment.

EXAMPLE 10

The Photocatalytic Activity of the Hydrosol for the Degradation of Formaldehyde
Instrument: Interscan 4160 Formaldehyde meter made in USA
Temperature: 25° C.
Reaction Time: 24 hours
Reactor chamber: $1.2 \times 0.6 \times 0.6$ m$^3$
The hydrosol loading: the hydrosol is sprayed on glass with area of $0.5 \times 0.5$ m$^2$
Total effective area: 1.25 m$^2$
Lamp for irradiation: a fluorescent lamp (18 w)
The content of titanium dioxide: 0.5% (w/w)
The volume of hydrosol: 30 ml
Humidity in chamber: 50-60%

TABLE 1

The photodegradation of formaldehyde by using different anatase hydrosol

| Test example | Pure TiO$_2$ | 1% Ce$^{3+}$—TiO$_2$ | 1% La$^{3+}$—TiO$_2$ | 1% Nd$^{3+}$—TiO$_2$ | 1% Fe$^{3+}$—TiO$_2$ | 0.5% Ag$^+$—TiO$_2$ |
|---|---|---|---|---|---|---|
| A | 3.05 | 3.11 | 3.18 | 3.26 | 3.04 | 3.45 |
| B | 0.69 | 0.36 | 0.46 | 0.63 | 0.74 | 0.26 |
| C (%) | 77.26 | 88.53 | 85.42 | 80.68 | 75.61 | 92.36 |

Note:
A = the initial concentration of formaldehyde (ppm);
B = the concentration of formaldehyde after 24 hours (ppm);
C = (A/B) × 100%

EXAMPLE 11

The Photocatalytic Activity of the Hydrosol for the Degradation of Benzene
Instrument: PGM 7200 Benzene Steam Detector
Reaction Temperature: 25° C.
Reaction Time: 48 hours Reactor chamber: $1.2 \times 0.6 \times 0.6$ m$^3$ The hydrosol loading: the hydrosol is sprayed on glass with area of $0.5 \times 0.5$ m$^2$
Total effective area: 1.25 m$^2$
Lamp for irradiation: a fluorescent lamp (18 w)
The content of titanium dioxide: 0.5% (w/w)
The volume of hydrosol: 30 ml
Humidity in chamber: 50-60%

TABLE 2

The photodegradation benzene of by using different anatase hydrosol

| Test example | pure TiO$_2$ | 1% Ce$^{3+}$—TiO$_2$ | 1% La$^{3+}$—TiO$_2$ | 1% Nd$^{3+}$—TiO$_2$ | 1% Fe$^{3+}$—TiO$_2$ | 0.5% Ag$^+$—TiO$_2$ |
|---|---|---|---|---|---|---|
| A | 35.5 | 38.2 | 33.6 | 34.8 | 31.9 | 38.5 |
| B | 9.8 | 5.6 | 6.6 | 7.1 | 7.8 | 6.7 |
| C (%) | 72.47 | 85.31 | 80.24 | 79.64 | 75.61 | 82.53 |

Note:
A = the initial concentration of benzene (ppm);
B = the concentration of formaldehyde after 24 hours (ppm);
C = (A/B) × 100%

EXAMPLE 12

Field Test for on Litchi Downy Blight Control by Using Different Anatase Hydrosol Test samples including pure TiO$_2$ hydrosol (T1), 1% La$^{3+}$ TiO$_2$ hydrosol (T2), 1% Fe$^{3+}$—TiO$_2$ hydrosol (T3), Ce$^{3+}$—TiO$_2$ hydrosol (T4), and 58% Ridomil MZ Wettable power dilute 800 times (T5) as well as water for control (T6), every treatment is repeated 4 times. Application method was described as follows: groups are divided randomly (six Huai Zhi trees whose crowns and fruit numbers are basically similar are selected and the crown of each tree is divided averagely into 4 equal parts. Each equal part is used as a small area for application. The same treatment is not implemented on a same tree). The first spray is made on 30 May, 2005. Spray is made at 9 to 10 day intervals, totally 4 times. The above test sample liquid is sprayed uniformly on leaves and fruits with GongNong 16 hand-operating knapsack sprayer until water drops.

Test of effect and Statistic: The incidence rate of the Litchi fruits affected by Litchi downy blight per small area is investigated respectively before application (30 May) and after the fourth application (4 June). Five points is randomly selected per small area and two bundles of fruits per point are investigated. Ten bundles of fruits per small area are investigated and calculate the total number of the fruits and the number of fruits affected by disease respectively. The incidence rate and prevention effect in each treated small area are calculated according to the following formula. Data which is transformed to Arcsine according to the requirement of Statistics is used to analyze significant difference of the result of the test by DMRT method. Incidence rate (%)=number of fruits affected by disease/number of the totally investigated fruits× 100%

The fruits of Litchi in the test field show no symptoms of disease before application. The prevention effect is calculated by using Abbott formula, namely: The prevention effect= (Ca−Ta/Ca)×100%, Wherein, Ca is the incidence rate in the control area after application, and Ta is the incidence rate in the treated control area after application.

TABLE 4

The inverse sine values obtained by conversing the prevention effect into square root and the test result of DMRT

| Treatment | $Sin^{-1}\sqrt{incidencerate\ \%}$ | | | | | Inversion of the mean value % | Control effect □%□ |
|---|---|---|---|---|---|---|---|
| | I | II | III | IV | mean | | |
| T1 | 21.93 | 19.04 | 20.94 | 28.70 | 22.65 Aab | 14.83 | 71.22 |
| T2 | 35.26 | 21.67 | 32.31 | 26.01 | 28.81 Ab | 23.22 | 54.93 |
| T3 | 19.47 | 19.25 | 31.38 | 23.33 | 23.36 Aab | 15.72 | 69.49 |
| T4 | 22.45 | 22.45 | 27.20 | 22.21 | 23.58 Aab | 16.00 | 68.94 |
| T5 | 12.04 | 16.66 | 15.95 | 23.41 | 17.02 Aa | 8.57 | 83.37 |
| T6 | 51.77 | 50.24 | 43.49 | 38.00 | 45.87 BC | 51.52 | — |

Note:
T1 = 0.1% (w/w) pure $TiO_2$ hydrosol;
T2 = 0.1% (w/w) 1% $La^{3+}$—$TiO_2$ hydrosol;
T3 = 0.1% (w/w) 1% $Fe^{3+}$—$TiO_2$ hydrosol;
T4 = 0.1% (w/w) 1% $Ce^{3+}$—$TiO_2$ hydrosol;
T5 = 58% Ridomil MZ Wettable Powder diluted 800 times;
T6 = Water for control. Same letter denotes non -significant difference (a, b represents p = 0.05; A, B, C P = 0.01)

The result obtained from the field test is listed in table 4. The mean incidence rate of Litchi downy blight is 15.34%, 22.64%, 16.92%, 16.08%, 8.57% and 51.52% (no the incidence in filed before application) for T1, T2, T3, T4, T5, T6 treatment, respectively. The results show that $TiO_2$ hydrosol should effective for Litchi downy blight control, even though their effect is less than that of Ridomil MZ Wettable powder. However□the hydrosol is nontoxic and innoxious and as well as can degrade residue pesticide simultaneity. That implies that the hydrosol is worth using for crop disease control.

EXAMPLE 13

The Negative Ions Amount Released by $Ce^{3+}$—$TiO_2$ Hydrosol
Hydrosol: $Ce^{3+}$—$TiO_2$ hydrosol prepared in example 2
Instrument: Ion detector
Reaction Temperature 25° C.
Reaction Time: 5 minutes
Reactor chamber: 1.2×0.6×0.6 $m^3$
The hydrosol loading: the hydrosol is sprayed on glass with area of 0.5×0.5 $m^2$
Total effective area: 1.25 $m^2$
Lamp for irradiation: a fluorescent lamp (18 w)
The content of titanium dioxide: 0.5% (w/w)
The volume of hydrosol: 30 ml
Humidity in chamber: 70-80%
All electric device are off during the test procedure.
The test is repeated three times under the same conditions. The amount of negative ions is 859/$cm^3$, 951 /$cm^3$, 922 /$cm^3$, respectively. The mean amount of generated negative ions is 923/$cm^3$. The result shows that $Ce^{3+}$—$TiO_2$ hydrosol can have a strong effect on releasing negative ions.

The invention claimed is:

1. A method for producing high-active titanium dioxide anatase hydrosol by using metatitanate as precursor, comprising the steps of:
   (1) adding water into the metatitanate and mixing uniformly to obtain a suspension;
      adding an alkali solution into the suspension to adjust pH value to be 7 to 13 to obtain an adjusted composition;
      stirring uniformly the adjusted composition at 10 to 40° C. to obtain a treated suspension;
      filtering the treated suspension to get a filter cake;
      washing the filter cake to remove sulfate ions;
      repeating the above steps one to three times; and
      adding water to wash the filter cake until the pH value is near to neutral;
   (2) adding water into the filter cake and mixing uniformly to obtain a watered composition;
      adding an acid solution into the watered composition to adjust pH value to be between 0.1 and 3.0 to obtain another adjusted composition; and
      stirring uniformly the another adjusted composition to obtain a uniform suspension;
   (3) peptizing the uniform suspension obtained in said step (2) according to one of the following methods (a), (b), and (c):
      (a) dispersing the uniform suspension for 3 to 60 hours while keep heating at 40 to 95° C. under stirring continuously to obtain the titanium dioxide anatase hydrosol;
      (b) dispersing the uniform suspension for 5-100 minutes to obtain a dispersed suspension, then heating the dispersed suspension for 0.5-40 hours under stirring continuously at 50 to 300° C. and under a pressure of $10^5$-$5\times10^6$ Pa to obtain the titanium dioxide anatase hydrosol;
      (c) dispersing the uniform suspension for 5 to 100 minutes to obtain a dispersed suspension, then heating the dispersed suspension under stirring continuously at 50 to 2000 W microwave power for 2 to 20 hours to obtain the titanium dioxide anatase hydrosol.

2. The method for producing high-active titanium dioxide anatase hydrosol by using metatitanate as precursor according to claim 1, wherein the alkali solution is selected from the group consisting of sodium hydroxide, potassium hydroxide, and ammonia.

3. The method for producing high-active titanium dioxide anatase hydrosol by using metatitanate as precursor according to claim 1, wherein the acid solution is selected from the group consisting of hydrochloric acid, nitric acid, acetic acid, and phosphoric acid.

4. The method for producing high-active titanium dioxide anatase hydrosol by using metatitanate as precursor according to claim 1, wherein in said step (1), a solution containing one of a transition metal salt and a rare earth metal salt is added into the suspension before adding the alkali solution into the suspension.

5. The method for producing high-active titanium dioxide anatase hydrosol by using metatitanate as precursor according to claim 4, wherein the rare earth metal salt is selected from the group consisting of lanthanum nitrate, cerium nitrate, neodymium nitrate, europium nitrate, and gallium nitrate.

6. The method for producing high-active titanium dioxide anatase hydrosol by using metatitanate as precursor according to claim 4, wherein the transition metal salt is selected from the group consisting of an iron salt and a copper salt.

7. The method for producing high-active titanium dioxide anatase hydrosol by using metatitanate as precursor according to claim 1, wherein in said step (1), a solution containing a precious metal salt is added into the suspension before adding the alkali solution into the suspension and then irradiated by ultraviolet light for 0.5-10 hours while stirring continuously.

8. The method for producing high-active titanium dioxide anatase hydrosol by using metatitanate as precursor according to claim 7, wherein the precious metal salt is selected from the group consisting of a gold salt, an argentine salt, and a platinum salt.

9. The method for producing high-active titanium dioxide anatase hydrosol by using metatitanate as precursor according to claim 1, wherein in said step (2), the pH value is adjusted to be 0.5 to 2.0.

10. The method for producing high-active titanium dioxide anatase hydrosol by using metatitanate as precursor according to claim 1, wherein in said substep (a) of said step (3), the uniform suspension is stirred for 8-50 hours while heating at the 40-95° C. to obtain the titanium dioxide anatase hydrosol.

11. The method for producing high-active titanium dioxide anatase hydrosol by using metatitanate as precursor according to claim 1,
wherein in said substep (b) of said step (3), the uniform suspension is dispersed for the 5 to 100 minutes to obtain the dispersed suspension, then heating the dispersed suspension for 2-20 hours at the 50-300° C. under the pressure of $10^5$-$5\times10^6$ Pa to obtain the titanium dioxide anatase hydrosol.

12. The method for producing high-active titanium dioxide anatase hydrosol by using metatitanate as precursor according to claim 1, wherein in said substep (c) of said step (3), the uniform suspension is dispersed for the 5 to 100 minutes to obtain the dispersed suspension, then heating the dispersed suspension for 3-10 hours at 100-600 W microwave power to obtain the titanium dioxide anatase hydrosol.

\* \* \* \* \*